(12) United States Patent
Von Känel

(10) Patent No.: US 10,535,707 B2
(45) Date of Patent: Jan. 14, 2020

(54) MONOLITHIC SILICON PIXEL DETECTOR, AND SYSTEMS AND METHODS FOR PARTICLE DETECTION

(71) Applicant: G-ray Industries SA, Hauterive (CH)

(72) Inventor: Hans Von Känel, Wallisellen (CH)

(73) Assignee: G-ray Industries SA, Hauterive (CH)

( * ) Notice: Subject to any disclaimer, the term of this patent is extended or adjusted under 35 U.S.C. 154(b) by 0 days.

(21) Appl. No.: 16/099,740

(22) PCT Filed: May 11, 2017

(86) PCT No.: PCT/IB2017/000562
§ 371 (c)(1),
(2) Date: Nov. 8, 2018

(87) PCT Pub. No.: WO2017/195024
PCT Pub. Date: Nov. 16, 2017

(65) Prior Publication Data
US 2019/0280042 A1    Sep. 12, 2019

Related U.S. Application Data

(60) Provisional application No. 62/334,514, filed on May 11, 2016.

(51) Int. Cl.
*G01T 1/164*    (2006.01)
*H01L 27/146*    (2006.01)
(Continued)

(52) U.S. Cl.
CPC ...... *H01L 27/14698* (2013.01); *H01J 37/244* (2013.01); *H01J 49/025* (2013.01);
(Continued)

(58) Field of Classification Search
CPC ......... H01L 27/14698; H01L 27/14659; H01L 27/14687; H01J 37/244; H01J 49/025;
(Continued)

(56) References Cited

U.S. PATENT DOCUMENTS 5,897,362 A    4/1999  Wallace
6,861,798 B1*  3/2005  Pan .................. H01J 9/242
                                           313/283
(Continued)

FOREIGN PATENT DOCUMENTS

EP         0571135 A2     11/1993
WO    WO2009071587 A2      6/2009
WO    WO2016097850 A1      6/2016

OTHER PUBLICATIONS

Segal J D et al: "Second generation monolithic full-depletion radiation sensor with integrated CMOS circuitry", Nuclear Science Syposium Conference Records (NSS/MIC), 2010 IEEE, IEEE, Oct. 30, 2010, pp. 1896-1900, pp. 1896-1898, figures 1, 3-5.
(Continued)

*Primary Examiner* — Nicole M Ippolito
(74) *Attorney, Agent, or Firm* — Da Vinci Parners LLC; John Moetteli

(57) ABSTRACT

Monolithic silicon pixel detectors, systems and methods for the detection and imaging of radiation in the form of charged particles or X-ray photons comprise a Si wafer with a CMOS processed readout communicating via implants for charge collection with an absorber forming a monolithic unit with the Si wafer to collect and process the electrical signals generated by radiation incident on the absorber. In particular, a monolithic CMOS integrated pixel detector includes several components. Such components include a p-doped silicon wafer with a resistivity of at least 1 kΩcm (220, 310, 310') having a front-side (224, 314, 314) comprising a CMOS processed readout electronics (250, 350) comprising pixel electronics (258, 358) and a backside (228, 318) opposite the front side. In addition, the pixel detector includes charge collectors (252, 352) communicating with the pixel electronics (258, 358) and defining the pixel size. Still further, high voltage contacts (282, 382) are provided.
(Continued)

The region of silicon wafer (220, 310, 310') below the charge collectors (252, 352) forms the absorber layer (226, 316) of pixel detector (240, 340). When the pixel detector (240, 340) is in operation, the charge collectors (252, 352) are disposed to receive electrical charges drifting across the absorber layer (226, 316) when generated by charged particles or X-ray photons (270, 370) incident on the absorber layer (226, 316). The readout electronics is disposed to convert said electrical charges into digital signals which can be stored, processed and displayed as images on a computer screen.

27 Claims, 2 Drawing Sheets

(51) Int. Cl.
| | | |
|---|---|---|
| | *H01J 49/16* | (2006.01) |
| | *H01J 49/02* | (2006.01) |
| | *H01J 37/244* | (2006.01) |
| | *H01J 37/26* | (2006.01) |

(52) U.S. Cl.
CPC ...... *H01J 49/164* (2013.01); *H01L 27/14659* (2013.01); *H01L 27/14687* (2013.01); *H01L 27/14689* (2013.01); *H01J 37/26* (2013.01); *H01J 2237/2445* (2013.01); *H01J 2237/2448* (2013.01)

(58) Field of Classification Search
CPC .. H01J 49/164; H01J 37/26; H01J 2237/2445; H01J 2237/2448
USPC ....... 250/306, 307, 309, 310, 311, 281, 282, 250/396 R, 397
See application file for complete search history.

(56) References Cited

U.S. PATENT DOCUMENTS

| 9,647,012 | B1* | 5/2017 | Liang ................... H01L 27/127 |
|---|---|---|---|
| 10,163,957 | B2* | 12/2018 | Von Kanel ........ H01L 27/14634 |
| 2006/0118728 | A1 | 6/2006 | Phlips et al. |
| 2011/0042576 | A1 | 2/2011 | Wilson et al. |
| 2014/0203386 | A1 | 7/2014 | Bui |
| 2015/0357480 | A1* | 12/2015 | Yu .................... H01L 21/02554 257/43 |

OTHER PUBLICATIONS

Mattiazzo S et al: "LePIX: First results from a novel monolithic pixel sensor", Nuclear Instruments & Menthods in Physics Research. Section A: Accelerators, Spectrometers, Detectors, and Associated Eqipment, vol. 718. Aug. 1, 2013, pp. 288-291; pp. 288-289, figures 1-2.

Wulf E A et al: "Wafer-Bonded Silicon Gamma-Ray Detectors", IEEE Transactions on Nuclear Science, IEEE Service Center, New York (US), vol. 55, No. 2, Apr. 1, 2006, pp. 790-796; pp. 790-795, figure 1.

R. Turchetta et al: "A monolithic active pixel sensor for charged particle tracking and imaging using standard VLSI CMOS technology", Nuclear Instruments and Mthods in Physics Research A 458, 2001, pp. 677-689.

P. Giubilato et al: "LePix—A high resistivity, fully depleted monolithic pixel detector", Nuclear Instruments and Methods in Physics Research, A 718, pp. 91-94.

W. Snoeys: "Monolithic pixel detectors for high energy physics", Nuclear Instruments and Methods in Physics Research, A 731, 2014, pp. 125-130.

C. Flötgen et al: Novel surface preparation methods for covalent and conductive bonded interfaces fabrication, ECS Transactions 64, 2014, pp. 103-110.

W. Snoeys: "Monolithic active pixel sensors for high energy physics", Nuclear Instruments and Methods in Physics Research, A 765, 2014, pp. 167-171.

T. Akatsu et al: "Dislocation structure in low-angle interfaces between bonded Si(001) wafers", Journal of Material Science 39, 2004, pp. 3031-3039.

M. Reiche: "Dislocation Networks Formed by Silicone Wafer Direct Bonding", Material Science Forum 590, 2008, pp. 57-78.

M. Battaglia et al: "Characterisation of a CMOS active pixel sensor for use in the TEAM microscope", in Nuclear Instruments and and Methods in Physics Research A 622, 2010, pp. 669-677.

A. Kiss et al: "Microscope mode secondary ion mass spectrometry imaging with a Timepix detector", Review of Scientific Instruments 84, 2013, 013704.

J.H. Jungman et al: "Fast, high resolution mass spectrometry imaging using a Medipix pixelated detector", Journal of American Society of Mass Spectronomy 21, pp. 2023-2030.

D. Henry et al: "TSV last for hybrid pixel detectors: Application to particle physics and imaging experiments", 2013 IEEE 63 Electronics Components and Technology, pp. 568-575.

PCT/IB2017/000562, Jul. 16, 2018, International Search Report of the International Searching Authority.

* cited by examiner

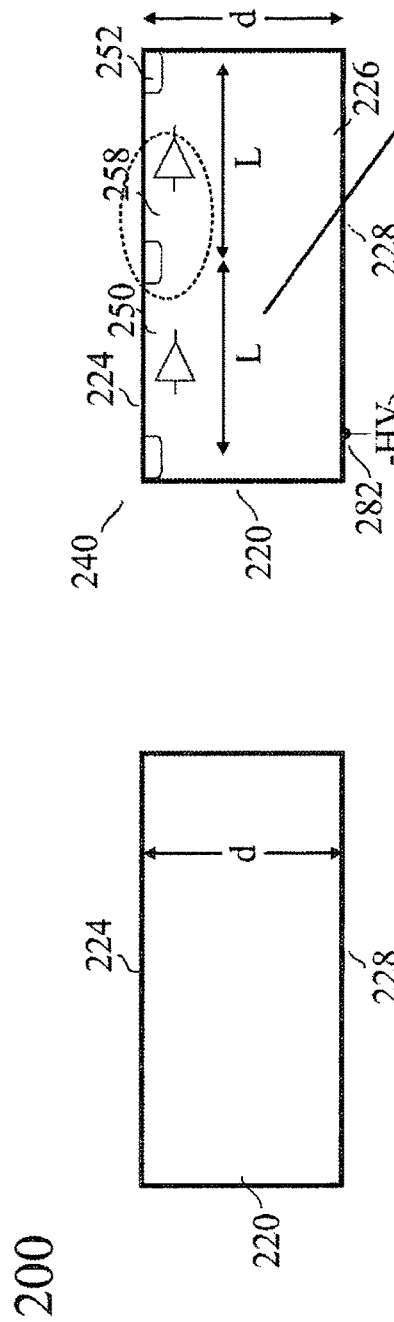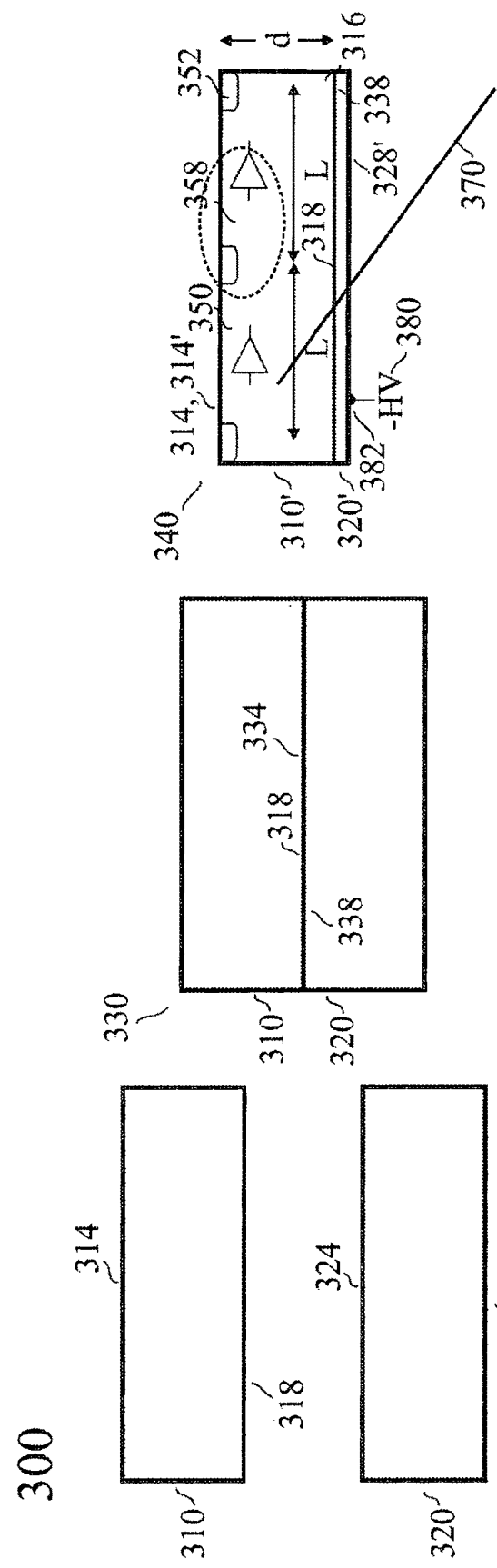

MONOLITHIC SILICON PIXEL DETECTOR, AND SYSTEMS AND METHODS FOR PARTICLE DETECTION

CROSS REFERENCE TO RELATED APPLICATIONS

This application is the National Stage of International Application No. PCT/IB2017/000562, filed May 11, 2017, which claims benefit under 35 USC § 119(a), to U.S. provisional patent application Ser. No. 62/334,514, filed May 11, 2016.

FIELD OF THE INVENTION

The invention relates to pixel detectors made from monolithic, Complementary Metal Oxide Semiconductor (CMOS) integrated structures for the imaging detection of radiation, and to methods for forming such structures and for their use.

BACKGROUND OF THE INVENTION

Digital imaging devices for direct detection of X-rays and mass particles are based on semiconductor absorbers in which incident radiation is transformed into electron-hole pairs which can then be measured as an electrical signal by a readout unit. Besides superior sensitivity and spatial and temporal resolution compared to scintillator based indirect conversion, direct detectors offer spectral resolution, because the number of electron-hole pairs generated in the absorber is proportional to the energy of the incident particles and thus measurable by a pulse height analysis.

Imaging detectors, also called pixel sensors, employing direct conversion by means of semiconductor absorbers, can currently be implemented essentially in two different ways.

In the first, the absorber is bonded onto the readout chip in order to realize the connections needed to process the electrical signal from every absorber pixel. The commonly used bonding technique, used, for example, by the Medipix collaboration (http://medipix.web.cern.ch) or by Dectris AG (http://www.dectris.ch), is bump bonding. In this approach the absorber can in principle consist of any semiconductor material suitable for X-ray detection or particle detection, such as Si, Ge, GaAs and CdTe (see, for example, European Patent No. 0571135 to Collins et al., the entire disclosure of which is hereby incorporated by reference and relied upon).

The second implementation of direct imaging detectors is based on the monolithic integration of the absorber with the readout electronics. When employing standard silicon CMOS processing for the readout, such monolithic pixel sensors are based on Si absorbers. They are also called Monolithic Active Pixel Sensors (MAPS) and have been developed for charged particle tracking. Charge collection is enabled by n-implants in a lightly p-doped epitaxial layer typically 12-16 µm in thickness and occurs mainly by diffusion in the original design (see, for example, R. Turchetta et al., in Nucl. Instrum. Meth. Phys. Res. A 458, 677 (2001), the entire disclosure of which is hereby incorporated by reference and relied upon).

More recently, charge collection primarily by drift has been achieved, for example, within the LePIX project by means of epitaxial p⁻-layers with higher resistivities on the order of 400 Ωcm (see, for example, S. Mattiazzo et al. in Nucl. Instrum. Meth. Phys. Res. A 718, 288 (2013), the entire disclosure of which is hereby incorporated by reference and relied upon). Fully depleted monolithic pixel sensors have even shown potential for soft X-ray detection (see, for example, P. Giubilato et al., in Nucl. Instrum. Meth. Phys. Res. A 732, 91 (2013), the entire disclosure of which is hereby incorporated by reference and relied upon). Charge collection by drift not only reduces charge collection times from above a hundred nanoseconds to ten nanoseconds and less, but also greatly enhances collection efficiency and radiation tolerance (see, for example, W. Snoeys in Nucl. Instrum. Meth. Phys. Res. A 732, 91 (2013), the entire disclosure of which is hereby incorporated by reference and relied upon). On the other hand, charges are collected by drift only from a fully depleted epitaxial layer, which is limited both in thickness (typically below 30 µm due to epitaxy costs) and resistivity (at most between about 1-5 kΩcm). By contrast, bump bonded absorbers can easily have depleted regions a few 100 µm in width permitting charge collection from a much larger volume.

A path towards the realization of monolithic pixel sensors comprising thick, high resistivity absorber layers suitable for full depletion has recently been described by von Kanel in the International Patent Application PCT/IB2015/002385, the entire disclosure of which is hereby incorporated by reference and relied upon. The approach is based on recently developed low-temperature, covalent wafer bonding technique (see, for example, C. Flötgen et al. in ECS Transactions 64, 103 (2014), the entire disclosure of which is hereby incorporated by reference and relied upon). With temperatures typically below 300° C., this bonding technique is applicable to CMOS-processed readout wafers. The latter need, however, to be thinned to a thickness of about 10-20 µm before the covalent bonding step in order to permit depletion of the highly resistive bonded absorber wafer, at the possible expense of costs and yield.

There exists a need therefore for a simpler, cost-effective fabrication of monolithic pixel sensors with thick, fully depleted absorption layers offering enhanced radiation tolerance, speed and charge collection.

SUMMARY OF THE INVENTION

Monolithic silicon pixel detectors, systems and methods for the detection and imaging of radiation in the form of charged particles or X-ray photons are made up of a Si wafer with a CMOS processed readout communicating via implants for charge collection with an absorber forming a monolithic unit with the Si wafer to collect and process the electrical signals generated by radiation incident on the absorber.

In particular, a monolithic CMOS integrated pixel detector for the detection of charged particles or X-ray photons includes several components. Such components include a p-doped silicon wafer with a resistivity of at least 1 kΩcm having a front-side comprising a CMOS processed readout electronics containing pixel electronics and a backside opposite the front side. In addition, the pixel detector includes charge collectors communicating with the pixel electronics and defining the pixel size. Still further, high voltage contacts are provided. The region of silicon wafer below the charge collectors forms the absorber layer of the pixel detector. When the pixel detector is in operation, the charge collectors are disposed to receive electrical charges drifting across the absorber layer when generated by charged particles or X-ray photons incident on the absorber layer. The readout electronics is disposed to convert said electrical charges into digital signals which can be stored, processed and displayed as images on a computer screen.

It is an object of the invention to provide a monolithic CMOS integrated pixel sensor suitable for soft X-ray and charged particle detection and imaging.

It is another object of the invention to provide a monolithic pixel sensor suitable for soft X-ray and charged particle detection and imaging, wherein the readout electronics and a high-resistivity silicon absorber are juxtaposed on opposite sides of a CMOS processed silicon wafer.

It is a further-object of the invention to provide a monolithic CMOS integrated pixel sensor suitable for soft X-ray and charged particle detection and imaging comprising a fully depleted silicon absorber.

It is yet a further object of the invention to provide a monolithic pixel sensor suitable for energy-resolved X-ray and charged particle detection and imaging.

It is yet another object of the invention to provide means for avoiding degraded electronic properties of monolithic pixel sensors during CMOS processing of the pixel electronics. The invention teaches the structure and fabrication methods of monolithic pixel detectors for the detection and imaging of radiation in the form of energetic particles which may have a mass or be massless (such as X-ray photons). The pixel detectors comprise a Si wafer with CMOS processed readout electronics communicating via implants for charge collection with a high-resistivity silicon absorber forming a monolithic unit to collect charges by drift and to process the electrical signals generated by radiation incident on the absorber. These and other objects of the invention are described in the drawings, specification and claims.

BRIEF DESCRIPTION OF THE DRAWINGS

FIG. 2A is a cross-sectional view of a high resistivity silicon wafer before CMOS processing of the readout unit of a monolithic pixel sensor.

FIG. 2B is a cross-sectional view of a monolithic pixel sensor processed from a high-resistivity silicon wafer.

FIG. 3A is a cross-sectional view of a high resistivity FZ and a low resistivity CZ silicon wafer.

FIG. 3B is a cross-sectional view of a high resistivity FZ wafer covalently bonded to a low resistivity CZ wafer.

FIG. 3C is a cross-sectional view of a monolithic pixel detector after thinning of the low resistivity CZ wafer.

DETAILED DESCRIPTION OF THE PREFERRED EMBODIMENTS

Figures 1A, 1B:
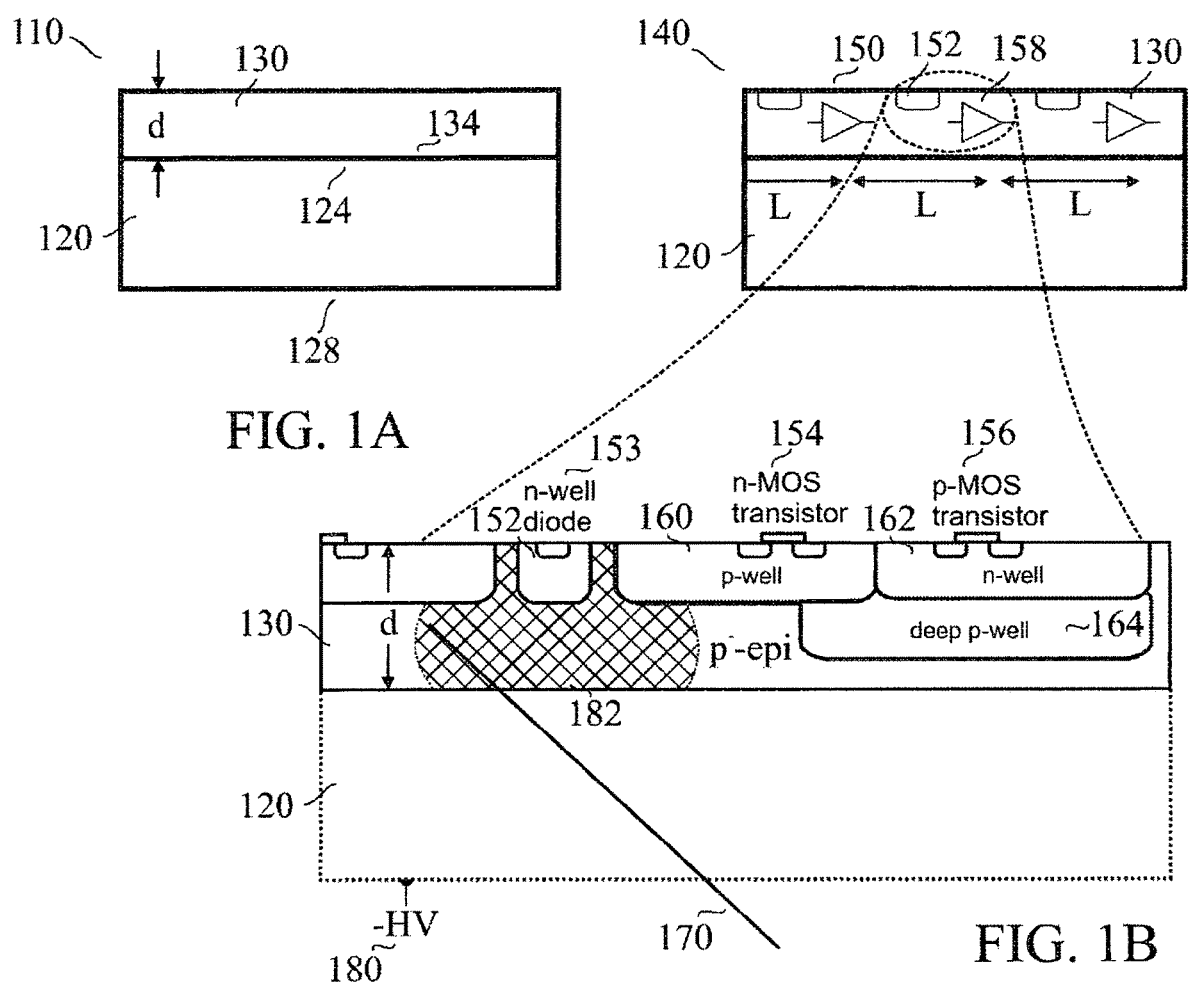
FIG. 1A is cross-sectional view of an epitaxial wafer before CMOS processing.
FIG. 1B is a cross-sectional view of a CMOS processed wafer made up of three pixels, and an enlarged view of one pixel.

It is the aim of this invention to solve the problem of insufficient depletion region width in monolithic pixel detectors limiting the collection of charge carriers by drift. Referring now to scheme 100 of FIG. 1A and FIG. 1B depicting a generic example of prior art (see, for example, S. Mattiazzo et al. in Nucl. Instrum. Meth. Phys. Res. A 718, 288 (2013); P. Giubilato et al., in Nucl. Instrum. Meth. Phys. Res. A 732, 91 (2013); W. Snoeys in Nucl. Instrum. Meth. Phys. Res. A 732, 91 (2013), the entire disclosures of which are hereby incorporated by reference and relied upon), this limitation is essentially related to the structure of these devices, made up of epitaxial wafer 110 made from low-resistivity, p-doped Czochralski (CZ) substrate silicon wafer 120 on the surface 124 of which is deposited highly resistive, lightly p-doped epitaxial layer 130 with thickness d by chemical vapor deposition (CVD), forming epitaxial interface 134 (FIG. 1A). FIG. 1B is a very schematic representation of the cross-section of a chip containing the readout electronics of a monolithic pixel detector along with the absorber layer underneath the readout electronics. Not shown are, for example, the guard rings at the periphery of the chip for high voltage protection, as well as the CMOS stack made up of multiple dielectric and metal layers and metal pads by which the chip is connected to the outside world.

According to FIG. 1B, the mode of working of monolithic pixel detector 140 may be understood as follows. CMOS readout electronics 150 comprises n-implants 152 and pixel electronics 158 for every pixel with n-MOS transistors 154 and p-MOS transistors 156 located in p-wells 160 and n-wells 162, respectively. Readout electronics 150 is processed within epitaxial layer 130, and n-implants 152 define pixels of size L. When detector 140 is in operation by applying reverse bias voltage 180 to n-well diode 153 formed by n-implants 152 within p⁻-doped epitaxial layer 130, implants 152 act as charge collectors communicating with pixel electronics 158 to collect, shape and process the electrical signals generated by charged particles or X-rays 170 impinging on epitaxial layer 130. Charge collection by n-implants 162 of p-MOS transistors 156 is thereby prevented by deep p-well implants 164. According to this design, epitaxial layer 130 acts as the absorber layer of detector 140. The width of depletion region 182 is essentially limited by the thickness d of epitaxial layer 130 because substrate 120 cannot be substantially depleted. The reason that substrate 120 cannot be substantially depleted from mobile charge carriers, except at excessively high bias voltages (for example 1000 V or even more), is its low resistivity which is typically in the range from a few mΩcm to a few Ωcm, for example between 10 mΩcm and 20-100 Ωcm. This has to be compared with the resistivity of the epitaxial layer typically ranging for example from a few hundred Ωcm to 1 kΩcm, or even from 1 kΩcm to 5 kΩcm.

TABLE 1

Depletion widths of p-doped Si layers of various resistivity at four bias voltages.

| | Resistivity [kΩ cm] | | | | |
|---|---|---|---|---|---|
| | 0.4 | 1 | 4 | 10 | 40 |
| Depletion width [μm] @ 50 V | 47 | 74 | 149 | 235 | 470 |
| Depletion width [μm] @ 100 V | 66 | 105 | 210 | 332 | 665 |
| Depletion width [μm] @ 200 V | 94 | 149 | 297 | 470 | 941 |
| Depletion width [μm] @ 400 V | 132 | 210 | 420 | 665 | 1330 |

Table 1 shows depletion widths of p-doped silicon with a resistivity of 0.4, 1, 4, 10 and 40 kΩcm at a reverse bias of 50 V, 100 V, 200 V and 400 V, respectively. Such p-doped silicon wafers with a resistivity of at least 1 kΩcm are also called "lightly p-doped" silicon wafers in the context of this disclosure. Resistivities of at least 1 kΩcm are also called "high resistivities" in said context. The depletion widths of Table 1 are much larger than widths d of epitaxial layer 130 which are typically below about 30 μm. Increasing d to 40 μm or more is an option at the expense of even higher epitaxy costs (see for example W. Snoeys in Nucl. Instrum. Meth. Phys. Res. A 765, 167 (2014), the entire disclosure of which is hereby incorporated by reference and relied upon).

One way to permit much larger depletion widths in monolithic pixel detectors, while avoiding the need of much thicker epitaxial layers, is to use low-temperature covalent bonding of a highly resistive float zone (FZ) silicon wafer after the CMOS processing of epitaxial wafer 110 (see, for example, von Känel in the International Patent Application PCT/IB2015/002385, the entire disclosure of which is hereby incorporated by reference and relied upon). The resistivity of FZ wafers can easily reach 10-20 kΩcm or 20-30 kΩcm or even more than 30 kΩcm. In order for the highly resistive FZ wafer to act as depleted absorber wafer, the conductive substrate wafer 120 has to be removed by grinding and polishing, however, to replace epitaxial interface 134 by the covalently bonded interface. On the other hand, thinning CMOS processed epitaxial wafer 110 to a thickness of 20 μm or even 10 μm poses the problem of cost and yield.

Referring now to FIGS. 2A and 2B, a first embodiment 200 of the method of the invention includes several steps. In a first step (1), the wafer 220 is provided with front side 224 and backside 228 (FIG. 2A). Wafer 220 is preferably a lightly p-doped FZ wafer with a resistivity in the range of 1-5 kΩcm, or 5-10 kΩcm, or 10-20 kΩcm, or preferably in the range of 20-30 kΩcm or even more preferably in the range of 30-50 kΩcm. In a second step (2), the wafer 220 is processed into monolithic pixel detector 240 (FIG. 2B) by providing readout electronics 250 on the front side 224 and high voltage contact 282 on the backside 228, the processing including processing CMOS wafer 220, to provide n-implants acting as charge collectors 252 which define the pixel size L and communicate with individual pixel electronics 258 to collect, shape and process the electrical signals generated by charged particles or X-rays 270 when detector 240 is in operation when a bias 280 is applied to high voltage contacts 282. The pixel size L may, for example, be in the range of 100-200 μm, or 50-100 μm, or 20-50 μm or even 5-20 μm. In embodiment 200 substantially all of the region below charge collectors 252 of high resistivity wafer 220 acts as absorber layer 226 of monolithic pixel detector 240 with a resistivity in the range of 1-5 kΩcm, or 5-10 kΩcm, or 10-20 kΩcm, or 20-30 kΩcm, 30-50 kΩcm. The thickness d of wafer 220 is preferably chosen in accordance with the desired depletion width when the diodes formed by n-implants and lightly p-doped wafer material are reverse biased at a chosen bias voltage 280. Resistivity of wafer 220 and bias voltage 280 are even more preferably chosen such that wafer 220 is fully depleted in its entire thickness d, such that charge carriers generated within move by drift.

It is understood that FIG. 2B is a simplified schematic only, showing, for example, neither the guard rings surrounding the pixelated areas of the chips nor the CMOS stack which is made up of multiple dielectric and metal layers and the metal pads providing the connections to the outside world.

TABLE 2

Fully depleted wafer thickness for different resistivity and reverse bias.

| | Resistivity [kΩ cm] | | | |
|---|---|---|---|---|
| | 5 | 20 | 30 | 50 |
| Fully depleted d [μm] @ 50 V | 166 | 332 | 407 | 526 |
| Fully depleted d [μm] @ 100 V | 235 | 470 | 575 | 744 |
| Fully depleted d [μm] @ 200 V | 333 | 665 | 814 | 1052 |
| Fully depleted d [μm] @ 400 V | 470 | 941 | 1151 | 1487 |

Table 2 shows the wafer thickness which can be fully depleted at bias 280 of, for example, 50, 100, 200 and 400 V, when wafer 220 has a resistivity of 5, 20, 30 or 50 kΩcm.

Referring now to FIG. 3, a second embodiment 300 of the method of the invention includes several steps. In a first step (1), the first wafer 310 is provided with front side 314 and backside 318. Wafer 310 may be a high resistivity, lightly p-doped FZ wafer with a resistivity in the range of 1-5 kΩcm, or 5-10 kΩcm, or 10-20 kΩcm, or preferably in the range of 20-30 kΩcm or even more preferably in the range of 30-50 kΩcm, and providing second wafer 320 with front side 324 and backside 328, which may, for example, be a standard p-doped CZ wafer with a resistivity between a few mΩ cm and a few Ωcm, for example, between 2 mΩ cm and 20-100 Ωcm (FIG. 3A). In a second step (2), the bonded wafer pair 330 is provided by forming covalent wafer bond 334 between the backside 318 of wafer 310 and front side 324 of wafer 320, thereby forming bonded interface 338 (FIG. 3B). It may be advisable to subject bonded wafer pair 330 to thermal annealing, for example, to temperatures between about 800° C. and 1100° C., thereby creating a regular dislocation network at bonded interface 338, the geometry of which can be tuned by tailoring mutual twist and tilt of wafers 310 and 320 (see, for example, T. Akatsu et al. in J. Mater. Sci. 39, 3031 (2004), the entire disclosure of which is hereby incorporated by reference and relied upon). Such a dislocation network may be beneficial for impurity gettering during subsequent CMOS processing of bonded wafer pair 330 (see, for example, M. Reiche in Materials Science Forum 590, 57 (2008), the entire disclosure of which is hereby incorporated by reference and relied upon). Alternatively, such a dislocation network may also form as a result of high temperature steps during the CMOS processing. Impurity diffusion during the processing of highly resistive FZ wafers may degrade the electric properties of the material, resulting, for example, in shorter minority carrier lifetimes and diffusion lengths. The dislocation network at the bonded interface may act as an impurity sink, thereby acting as a getter material. In an aspect of the embodiment, in a further step, wafer 310 may be optionally thinned to wafer 310' of chosen thickness d, for example, in a range from 20-300 μm, with new front surface 314' before processing wafer 310, 310' into monolithic pixel detector 340. Preferably, the thinning of wafer 310 is carried out after it is bonded to wafer 320. Bonded wafer 320 may thereby act as carrier wafer providing mechanical stability during the thinning. In a third step (3), the bonded wafer pair 330 is processed into monolithic pixel detector 340 by providing readout electronics 350 on front surface 314' by CMOS processing to form n-implants acting as charge collectors which define the pixel size L and communicate with individual pixel electronics 358 to collect, shape and process the electrical signals generated by charged particles or X-rays 370 when detector 340 is in operation. The pixel size L may, for example, be in the range of 100-200 μm, or 50-100 μm, or 20-50 μm or even 5-20 μm. In embodiment 300 substantially all of the region below charge collectors 352 of high resistivity wafer 310' acts as absorber layer 316 of monolithic pixel detector 340 with a resistivity in the range of 1-5 kΩcm, or 5-10 kΩcm, or 10-20 kΩcm, or 20-30 kΩcm, 30-50 kΩcm. The thickness d of optionally thinned wafer 310' is preferably chosen in accordance with the desired depletion width when detector 340 is in operation upon applying bias voltage 380 to back contact 382. Preferably, bonded CZ wafer 320 is partially or completely removed by thinning after the CMOS processing and prior to forming back contact 382 on lower surface 328'. Apart from providing mechanical stability during the optional thinning of wafer 310, the main purpose of bonded CZ wafer 320 is to getter impurities during the CMOS processing of wafer pair 330. This getter action is expected to improve the minority carrier properties (lifetimes, diffusion lengths) of processed wafer pair 330, which will persist even after the complete removal of wafer 320, in which the impurities trapped in the interfacial dislocation network are simultaneously removed. On the other hand, when wafer 320 is only thinned to a thin layer but not entirely removed, it may result in back contact 382 to become an ohmic back contact. Similar to embodiment 200, diodes formed by n-implants 352 and the lightly p-doped material of wafer 310' are reverse biased at bias voltage 380, preferably chosen to deplete substantially the entire thickness d of wafer 310'.

It is understood that FIG. 3C is a simplified schematic only, showing, for example, neither the guard rings surrounding the pixelated areas of the chips nor the metal pads providing the connections to the outside world.

Exemplary Applications of the Monolithic Pixel Detector in Medical, Industrial and Scientific Systems and Methods The pixel detector of the present invention is integrated into and used in methods of the following applications as described below.

Synchrotron Beamline-Based Applications

The pixel detector may be used for studies made up of X-ray nanodiffraction, imaging and microscopy experiments at synchrotron beamlines. It offers superior spatial resolution with pixel sizes which can easily reach 20-50 µm or even 5-20 µm, while for current bump bonded detectors, it is difficult to attain a pixel size below 50 µm (see, for example, C. Falub et al, in Scientific Reports 3, 2276 (2013)). The improved resolution enables, for example, the imaging of nano-scale objects, such as quantum dots and quantum wires. In combination with fast image processing techniques, the pixel detector permits the study of dynamic phenomena, for example, in biological specimen at unprecedented spatial resolution.

Transmission Electron Microscopy and Secondary Electron Microscopy Example

The pixel detector may be used in systems and methods for transmission electron microscopy for example for the observation of the dynamics of processes at an atomic scale (see, for example, M. Battaglia et al., in Nucl. Instr. Meth. Phys. Res. A 622, 669 (2010)). For example, the pixelated absorber of the invention which is made up of small absorber patches and thinned drift region of the readout wafer may give rise to exceptionally high spatial resolution due to reduced backscattering of electrons in the absorber patches. The resolution of the pixel detector of the invention may be as high as 5-20 µm or even below 5 µm. Similar advantages apply to Secondary Electron Microscopy (SEM). In both cases, the single-photon detection capability of the pixel detector of the invention may also be used for energy discrimination by a pulse height analysis of electrons or photons generated by electron impact in the investigated material.

Mass Spectrometry Imaging Example

The pixel detector may be used in systems and methods for mass spectrometry imaging (MSI). There are two different approaches for MSI: (1) secondary ion mass spectrometry (SIMS) that uses a charged primary ion beam for ionization and (2) matrix-assisted laser desorption-ionization (MALDI) that uses a focused laser light source. Both modes may use pixel detectors. For microscope mode SIMS, see, for example, A. Kiss et al. in Rev. Sci. Instrum. 84 (2013). For MALDI, see, for example, J. H. Jungmann et al., in J. Am. Soc. Mass Spectrom. 21, 2023 (2010). For example the pixelated absorber of the invention made up of small absorber patches and thinned drift region of the readout wafer may give rise to exceptionally high spatial resolution due to reduced backscattering in the absorber patches. The resolution of the pixel detector of the invention may be as high as 5-40 µm or even 1-5 µm.

Charged Particle Example

The pixel detector may be used in systems and methods for charged particle detection and imaging with a spatial resolution of at least 20-50 µm. The pixel detector of the invention is easier and cheaper to scale to large area detectors or even flat panel detectors than approaches requiring through-silicon vias (TSVs, see, for example, D. Henry et al. in Proc. Electronics Components and Technology conference 2013, pp. 568). The pixel detector of the invention also offers the advantage of higher resistivity absorber layers, facilitating full carrier depletion at moderate applied voltages of, for example, 100-500 V or 50-100 V even for higher absorber layer thicknesses of, for example, 30 to 100 µm or 100 to 500 µm or 500 to 2000 µm, in comparison with monolithic detectors fabricated without the bonding of highly resistive absorber wafers (see, for example, P. Giubilato et al. in Nucl. Instr. Meth. Phys. Res. A 732, 91 (2013).

In a further embodiment, the method of the invention provides a means for gettering impurities in a monolithic CMOS integrated pixel detector for the detection of charged particles or X-ray photons and includes several steps. In a first step, a p-doped silicon wafer is provided with a resistivity of at least 1 kΩcm (220, 310, 310') with a front side (224, 314, 314') and a backside (228, 318). In a second step, a covalent wafer bond (334) is provided between the backside (318) of said high resistivity wafer (310, 310') and the front side (324) of a low resistivity p-doped wafer (320, 320'), thereby providing a bonded interface (338) on the backside (318) of said high resistivity wafer (310, 310'). In a third step, a dislocation network is provided at said interface by thermal annealing, for example, to temperatures between about 800° C. and 1100° C. The method optionally further includes the step of partially or completely removing said low resistivity wafer (320, 320'), wherein optionally, removing said low resistivity wafer (320, 320') comprises, for example, thinning the low resistivity wafer after said silicon wafer is provided with readout electronics (250, 350) by CMOS processing the silicon wafer on the front side. Here, the high-voltage contacts (282, 382) are optionally provided on the backside (228, 318) of the high resistivity wafer (220, 310, 310') after completely removing the low resistivity wafer (320, 320') or on the backside (328') of low resistivity wafer (320') after the optional thinning of said low resistivity wafer (320, 320').

In further embodiments, each embodiment of the pixel detector of the invention herein described may be a component of several distinct systems. Such systems may be or include (1) a setup for synchrotron beamline studies having at least an X-ray nanodiffraction and imaging device; (2) a system for transmission electron microscopy and secondary electron microscopy having at least a device for the observation of the dynamics of processes at an atomic scale, optionally, wherein the pixel detector is an exceptionally high spatial resolution detector above a resolution of at least 20 µm; (3) a device for mass spectrometry imaging, optionally, wherein the pixel detector is selected from the group comprising pixel detectors adapted for secondary ion mass spectrometry (SIMS) and pixel detectors adapted for mass spectrometry using matrix-assisted laser desorption-ionization (MALDI) with a focused laser light source having a spatial resolution of at least 5-40 µm; or (4) a device for charged particle detection and imaging having at least an absorber layer thickness between 30 and 100 µm.

The patents and articles/publications mentioned above and below, in the addendum, are hereby incorporated by reference herein, unless otherwise noted, to the extent the same are not inconsistent with this disclosure.

Other characteristics and modes of execution of the invention are described in the appended claims.

Further, the invention should be considered as made up of all possible combinations of every feature described in the instant specification, appended claims, and/or drawing figures which may be considered new, inventive and industrially applicable.

Multiple variations and modifications are possible in the embodiments of the invention described here. Although certain illustrative embodiments of the invention have been shown and described here, a wide range of modifications, changes, and substitutions is contemplated in the foregoing disclosure. While the above description contains many specifics, these should not be construed as limitations on the scope of the invention, but rather as exemplifications of one or another preferred embodiment thereof. In some instances, some features of the present invention may be employed without a corresponding use of the other features. Accordingly, it is appropriate that the foregoing description be construed broadly and understood as being given by way of illustration and example only, the spirit and scope of the invention being limited only by the claims which ultimately issue in this application.

ADDENDUM

The following US patent documents, foreign patent documents, and additional publications are incorporated herein by reference thereto, as if fully set forth herein, and relied upon:

| US patent documents | | |
|---|---|---|
| 62295720 | February 2016 | von Känel |
| Other patent documents | | |
| EP0571135 A2 | November 1993 | Collins et al. |
| PCT/IB2015/002385 | December 2015 | von Känel |

ADDITIONAL ARTICLES/PUBLICATIONS

R. Turchetta et al., "A monolithic active pixel sensor for charged particle tracking and imaging using standard VLSI CMOS technology", Nuclear Instruments and Methods in Physics Research A 458, 677-689 (2001)

S. Mattiazzo et al., "LePIX: First results from a novel monolithic pixel sensor", Nuclear Instruments and Methods in Physics Research A 718, 288-291 (2013)

P. Giubilato et al., "LePix-A high resistivity, fully depleted monolithic pixel detector", Nuclear Instruments and Methods in Physics Research A 732, 91-94 (2013)

W. Snoeys "Monolithic pixel detectors for high energy physics", Nuclear Instruments and Methods in Physics Research A 731, 125-130 (2013)

C. Flötgen et al., "Novel surface preparation methods for covalent and conductive bonded interfaces fabrication", ECS Transactions 64, 103-110 (2014)

W. Snoeys, "CMOS monolithic active pixel sensors for high energy physics", Nuclear Instruments and Methods in Physics Research A 765, 167-171 (2014)

T. Akatsu et al., "Dislocation structure in low-angle interfaces between bonded Si (001) wafers", Journal of Material Science 39, 3031-3039 (2004)

M. Reiche, "Dislocation Networks Formed by Silicon Wafer Direct Bonding", Material Science Forum 590, 57-78 (2008)

M. Battaglia et al., "Characterisation of a CMOS active pixel sensor for use in the TEAM microscope", in Nuclear Instruments and Methods in Physics Research A 622, 669-677 (2010)

A. Kiss et al., "Microscope mode secondary ion mass spectrometry imaging with a Timepix detector", Review of Scientific Instruments 84, 013704 (2013)

J. H. Jungmann et al., "Fast, high resolution mass spectrometry imaging using a Medipix pixelated detector", Journal of the American Society of Mass Spectrometry 21, 2023-2030 (2010)

D. Henry et al., "TSV last for hybrid pixel detectors: Application to particle physics and imaging experiments", 2013 IEEE $63^{rd}$ Electronics Components and Technology Conference pp. 568-575

What is claimed is:

1. A monolithic CMOS integrated pixel detector for the detection of charged particles or X-ray photons, comprising
   a. a high resistivity p-doped silicon wafer with a resistivity of at least 1 kΩcm having a front-side comprising CMOS processed readout electronics comprising pixel electronics and a backside opposite the front side;
   b. charge collectors communicating with the pixel electronics and defining the pixel size;
   c. a covalent wafer bond between a backside of the high resistivity wafer and a front side of a low resistivity p-doped wafer comprising an impurity getter in the form of a dislocation network at the bonded interface; and
   d. high voltage contacts;
   wherein the region of silicon wafer disposed below the charge collectors forms the absorber layer of pixel detector; and wherein when pixel detector is in operation, the charge collectors are disposed to receive electrical charges drifting across the absorber layer when generated by charged particles or X-ray photons incident on the absorber layer; and wherein the readout electronics is disposed to convert said electrical charges into digital signals which can be stored, processed and displayed as images on a computer screen.

2. The monolithic CMOS integrated pixel detector of claim 1, wherein the absorber layer comprises a resistivity selected from one of a group of ranges consisting of 1-5 kΩcm, 5-10 kΩcm, 10-20 kΩcm, 20-30 kΩcm and 30-50 kΩcm.

3. The monolithic CMOS integrated pixel detector of claim 1, wherein the high resistivity p-doped silicon wafer comprises a resistivity selected from one of a group of ranges consisting of 1-5 kΩcm, 5-10 kΩcm, 10-20 kΩcm, 20-30 kΩcm and 30-50 kΩcm.

4. The monolithic CMOS integrated pixel detector of claim 1, wherein the low resistivity p-doped wafer has a resistivity between 2 mΩ cm and 100 Ωcm.

5. The monolithic CMOS integrated pixel detector of claim 1, wherein the absorber layer is fully depleted when pixel detector is in operation.

6. The monolithic CMOS integrated pixel detector of claim 1, wherein the pixel size comprises a size selected from one of a group of size ranges consisting of 100-200 μm, 50-100 μm, 20-50 μm and 5-20 μm.

7. The monolithic CMOS integrated pixel detector of claim 1, wherein the p-doped, high resistivity silicon wafer is bonded to a p-doped, low resistivity wafer by a covalent wafer bond with a bonded interface.

8. The monolithic CMOS integrated pixel detector of claim 7, wherein the low resistivity wafer is thin.

9. The monolithic CMOS integrated pixel detector of claim 7, wherein the bonded interface comprises a dislocation network.

10. A system for synchrotron beamline studies having at least an X-ray nanodiffraction and imaging device, further comprising the pixel detector of claim 1.

11. The system of claim 10, wherein the pixel detector is adapted to study nano-scale objects such as quantum dots and quantum wires.

12. The system of claim 10, wherein the pixel detector is adapted to study dynamic phenomena at high spatial resolution.

13. A system for transmission electron microscopy and secondary electron microscopy having at least a device for the observation of the dynamics of processes at an atomic scale, comprising the pixel detector of claim 1.

14. The system of claim 13, wherein the pixel detector is an exceptionally high spatial resolution detector above a resolution of at least 20 µm.

15. A system for mass spectrometry imaging having at least a spatial resolution of 5-40 µm, comprising the pixel detector of claim 1.

16. The system of claim 15, wherein the pixel detector is selected from the group comprising pixel detectors adapted for secondary ion mass spectrometry (SIMS) and pixel detectors adapted for mass spectrometry using matrix-assisted laser desorption-ionization (MALDI) with a focused laser light source.

17. A system for charged particle detection and imaging having at least a spatial resolution of 20-50 µm, comprising the pixel detector of claim 1.

18. The system of claim 17, wherein the pixel detector is adapted to high resistivity absorber layers made from a p-doped silicon wafer comprising a resistivity selected from a one of list of ranges comprising 1-5 kΩcm, 5-10 kΩcm, 10-20 kΩcm, 20-30 kΩcm and 30-50 kΩcm, such high resistivity absorber layers facilitating full carrier depletion at applied voltages selected from one of a list of voltages, consisting of 50 V, 100 V, 200 V and 400 V, at a range of thicknesses of the absorber layer between 74 µm and 1487 µm.

19. A method for forming a monolithic CMOS integrated pixel detector for the detection of charged particles or X-ray photons, the method comprising steps of
  a. providing a high resistivity p-doped silicon wafer with a resistivity of at least 1 kΩcm with a front side and a backside;
  b. providing a low resistivity p-doped silicon wafer with a front side and a backside;
  c. providing a wafer pair by forming a covalent wafer bond between the backside of said high resistivity wafer and the front side of the low resistivity p-doped wafer, thereby providing a bonded interface on the backside of said high resistivity wafer;
  d. creating a dislocation network at the bonded interface disposed to getter impurities by annealing the wafer pair to temperatures between 800-1100° C.;
  e. providing a readout electronics comprising a pixel electronics by CMOS processing the silicon wafer on the front side;
  f. providing charge collectors above an absorber layer disposed to receive electrical charges when generated by charged particles or X-ray photons incident on the absorber layer;
  g. providing high voltage contacts on the backside of the low resistivity p-doped wafer;
  h. disposing the readout electronics so as to convert said electrical charges into digital signals; and storing, processing and displaying the signals as images on a computer screen.

20. The method of claim 19, wherein providing the high resistivity wafer comprises providing a wafer with a resistivity selected from one of the group of resistivity ranges consisting of 1-5 kΩcm, 5-10 kΩcm, 10-20 kΩcm, 20-30 kΩcm and 30-50 kΩcm.

21. The method of claim 19, wherein providing the high voltage contacts with a bias voltage provides the high resistivity wafer with a depletion region extending between the charge collectors and the backside.

22. The method of claim 19, wherein the geometry of the dislocation network created at said interface is tuned by tailoring mutual twist and tilt of high resistivity wafer and low resistivity wafer.

23. A method for gettering impurities in a monolithic CMOS integrated pixel detector for the detection of charged particles or X-ray photons, the method comprising steps of:
  a. providing a p-doped silicon wafer with a resistivity of at least 1 kΩcm with a front side and a backside;
  b. providing a covalent wafer bond between said high resistivity wafer and a low resistivity p-doped wafer, thereby providing a bonded interface on the backside of said high resistivity wafer; and
  c. providing a dislocation network at said interface.

24. The method of claim 23, further comprising the steps of partially or completely removing said low resistivity wafer.

25. The method of claim 24, wherein removing said low resistivity wafer comprises thinning the low resistivity wafer.

26. The method of claim 24, wherein said low resistivity wafer is partially or completely removed after said silicon wafer is provided with readout electronics by CMOS processing the silicon wafer on the front side.

27. The method of claim 26, wherein high-voltage contacts are provided on the backside of the high resistivity wafer after partially or completely removing the low resistivity wafer.

* * * * *